United States Patent
Moriya et al.

(10) Patent No.: US 7,723,133 B2
(45) Date of Patent: May 25, 2010

(54) METHOD FOR FORMING PATTERN, AND METHOD FOR MANUFACTURING LIQUID CRYSTAL DISPLAY

(75) Inventors: Katsuyuki Moriya, Azumino (JP); Toshimitsu Hirai, Chino (JP)

(73) Assignee: Seiko Epson Corporation (JP)

( * ) Notice: Subject to any disclaimer, the term of this patent is extended or adjusted under 35 U.S.C. 154(b) by 104 days.

(21) Appl. No.: 11/769,301

(22) Filed: Jun. 27, 2007

(65) Prior Publication Data

US 2008/0026499 A1    Jan. 31, 2008

(30) Foreign Application Priority Data

Jul. 25, 2006  (JP) .............................. 2006-201663

(51) Int. Cl.
*H01L 21/00* (2006.01)

(52) U.S. Cl. ............................ 438/30; 348/22; 348/584; 348/758; 257/E21.002; 257/E21.256; 257/E21.264

(58) Field of Classification Search .................. 438/22, 438/30, 584, 758; 257/E21.256, E21.264, 257/E21.002; 349/1–8
See application file for complete search history.

(56) References Cited

U.S. PATENT DOCUMENTS

| | | | |
|---|---|---|---|
| 6,506,675 B1 * | 1/2003 | Oomiya et al. | ............... 438/677 |
| 6,766,817 B2 | 7/2004 | da Silva | |
| 6,918,404 B2 | 7/2005 | da Silva | |
| 7,066,586 B2 | 6/2006 | da Silva | |
| 7,220,682 B2 | 5/2007 | Hirai | |
| 7,326,585 B2 | 2/2008 | Hirai | |
| 7,387,903 B2 | 6/2008 | Sakai et al. | |
| 2005/0163938 A1 * | 7/2005 | Yamazaki et al. | ........... 427/554 |
| 2005/0196969 A1 * | 9/2005 | Gunner et al. | .............. 438/725 |
| 2006/0084206 A1 | 4/2006 | Moriya et al. | |
| 2007/0194449 A1 | 8/2007 | Hirai | |

FOREIGN PATENT DOCUMENTS

| | | |
|---|---|---|
| CN | 1575102 | 2/2005 |
| CN | 1764352 | 4/2006 |
| JP | 2002-072502 | 3/2002 |
| JP | 2004-363561 | 12/2004 |
| JP | 2006-156426 | 6/2006 |
| KR | 2005-0008493 | 1/2005 |

* cited by examiner

*Primary Examiner*—Alexander G Ghyka
*Assistant Examiner*—Abdulfattah Mustapha
(74) *Attorney, Agent, or Firm*—Harness, Dickey & Pierce, P.L.C.

(57) ABSTRACT

A method for forming a pattern, comprises: forming a bank film on a substrate; performing a lyophobic treatment on a surface of the bank film; patterning the bank film on which the lyophobic treatment has been performed to form a bank; performing a surface modification treatment in which a hydroxyl group on a surface of a pattern forming region partitioned by the bank is alkylated; disposing a functional liquid in the pattern forming region; and firing the functional liquid to form a pattern.

12 Claims, 12 Drawing Sheets

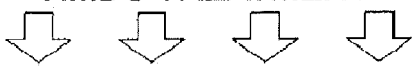
FIG. 1A
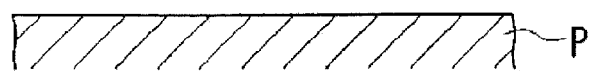
FIG. 1B
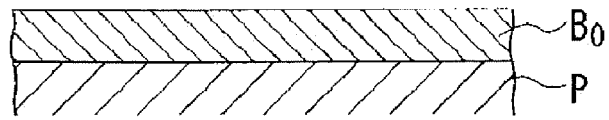
FIG. 1C
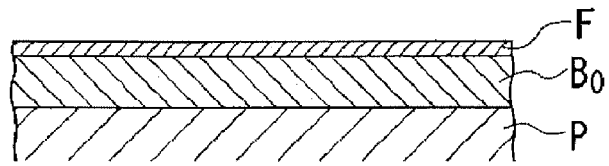
FIG. 1D
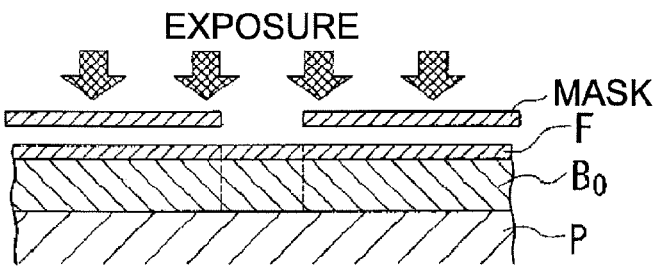
FIG. 1E
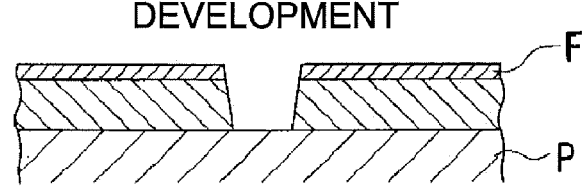

METHOD FOR FORMING PATTERN, AND METHOD FOR MANUFACTURING LIQUID CRYSTAL DISPLAY

BACKGROUND

1. Technical Field

The present invention relates to a method for forming a pattern and a method for manufacturing a liquid crystal display.

2. Related Art

Photolithography, for example, is used for manufacturing devices having wiring lines, such as electronic circuits and integrated circuits. In photolithography, a photosensitive material called a resist is coated on a substrate on which a conductive film has been coated so that a circuit pattern is exposed and developed, and then the conductive film is etched corresponding to a resist pattern to form a thin film wiring pattern. However, photolithography needs large-scale equipment such as vacuum apparatuses and cumbersome processes. In addition, almost all of materials are wasted due to a low efficiency of about several percent in using the materials, resulting in high manufacturing costs.

Alternatively, a method is proposed in which a wiring pattern is formed on a substrate using a droplet discharge method (called an inkjet method) in which a liquid material is discharged from a liquid discharge head as a droplet. For example, the method is disclosed in JP-A-2002-72502.

In the method, an ink for forming a wiring pattern is directly coated on the substrate as a pattern. The ink is a functional liquid in which a conductive fine particle such as a metal fine particle or the like is dispersed. Then, heat treatment and laser irradiation are carried out so that the ink is converted into a conductive thin film pattern. This method has a merit that no photolithography is needed, drastically simplifying processes and reducing the amount of raw materials.

When film patterns are formed on a substrate by using an inkjet method, a bank structure called a bank is typically formed in order to prevent ink from spreading. The surface of the bank is subjected to a lyophobic treatment to prevent the bank from ink adhering. In this case, a problem arises in that ink does not smoothly flows in an area surrounded by the bank due to lyophobicity given to the whole bank, lowering the wettability of the ink with respect to the side surface of the bank. In addition, ink is repelled on the side surface of the bank, resulting in a formed film being uneven. Therefore, it is in great demand that wettability is improved in an area that ink is discharged to and is partitioned by the bank.

SUMMARY

An advantage of the invention is to provide a method for forming a pattern, which method can stably form a highly reliable pattern, and a method for manufacturing a liquid crystal display.

A method for forming a pattern according to a first aspect of the invention includes: forming a bank film on a substrate; performing a lyophobic treatment on a surface of the bank film; patterning the bank film on which the lyophobic treatment has been performed to form a bank; performing a surface modification treatment in which a hydroxyl group on a surface of a pattern forming region partitioned by the bank is alkylated; disposing a functional liquid in the pattern forming region; and firing the functional liquid to form a pattern.

According to the method, the hydroxyl (—OH) group on the surface of the pattern forming region partitioned by the bank is substituted with, for example, the methyl (—$CH_3$) group by the surface modification treatment. The surface includes the side surface of the bank and a substrate surface, which is exposed in an area partitioned by the bank. When a functional liquid including a hydrocarbon based dispersion medium is used, the pattern forming region whose surface has the substituted methyl (—$CH_3$) group shows high wettability with respect to the functional liquid. Thus, the functional liquid disposed to the pattern forming region is repelled on the upper surface of the bank on which the lyophobic treatment has been performed, favorably wetting and spreading in the pattern forming region that shows high wettability.

As a result, a highly reliable pattern with uniform thickness can be formed since the functional liquid smoothly flows in the pattern forming region.

In the method, the surface of the pattern forming region is preferably exposed to a vapor of hexamethylsilazane as the surface modification treatment.

Exposing the surface of the pattern forming region to the vapor of hexamethylsilazane (($CH_3$)$_3$SiNHSi($CH_3$)$_3$) can enhance alkylation (methylation) of the hydroxyl (—OH) group. As a result, wettability in the pattern forming region can be improved.

In the method, the functional liquid preferably includes a hydrocarbon based dispersion medium.

With respect to the functional liquid, the pattern forming region whose surface has the substituted methyl (—$CH_3$) group shows high wettability.

In the method, firing the bank is preferably provided before disposing the functional liquid.

For example, if the lyophobic treatment is performed to the bank by coating a fluororesin on the surface of the bank film, sublimates produced from the fluororesin material by thermally decomposing may adhere in the pattern forming region by being bonded to the hydroxyl (—OH) group on the surface of the pattern forming region. The sublimates lower wettability in the pattern forming region, hindering a favorable pattern from being formed. In order to form a favorable pattern, the pattern forming region needs cleaning with hydrofluoric acid (HF) to remove the sublimates after the bank is formed, which makes a pattern forming step cumbersome.

In contrast, the method can prevent the sublimates from adhering in the pattern forming region by substituting the hydroxyl (—OH) group, to which the sublimates are easily bonded, in the pattern forming region with the methyl (—$CH_3$) group by the surface modification treatment. As a result, the pattern forming step can be simplified since the cleaning with hydrofluoric acid is not needed.

In the method, the bank and the disposed functional liquid are preferably fired together at once after the functional liquid is disposed in the pattern forming region.

This collective firing can omit the firing step of the bank, realizing reduction of processing time in the pattern forming step.

In the method, the bank film is preferably formed by a material that includes any one of polysilazane, polysilane, and polysiloxane.

Since the material forming the bank film includes an inorganic material containing any one of polysilazane, polysilane, and polysiloxane, the bank has high heat resistance. In addition, the difference in thermal expansion rate between the bank and the substrate is lessened. Therefore, the deterioration of the bank due to heat in drying the functional liquid and the like can be suppressed, whereby the pattern can be formed in a favorable shape. That is, the method can accurately and stably form the pattern.

In the method, the bank film is preferably formed by a photosensitive material that includes any one of polysilazane, polysilane, and polysiloxane.

Using the photosensitive material can make patterning the bank easy.

In the method, the pattern is preferably a wiring line.

The method can accurately and stably form the wiring line having uniform thickness.

In the method, the pattern is preferably a transparent electrode.

The method can form the transparent electrode made of ITO, for example, with high accuracy and uniform thickness.

In the method, the pattern is preferably a color filter included in a liquid crystal display.

The method can form the color filter included in the liquid crystal display with high accuracy and uniform thickness.

A method for manufacturing a liquid crystal display provided with a color filter according to a second aspect of the invention includes: forming a bank film on a substrate; performing a lyophobic treatment on a surface of the bank film; patterning the bank film on which the lyophobic treatment has been performed to form a bank; performing a surface modification treatment in which a hydroxyl group on a surface of a color filter forming region partitioned by the bank is alkylated; disposing a color filter forming material in the color filter forming region; and firing the color filter forming material to form the color filter.

According to the method, the hydroxyl (—OH) group on the surface of the color filter forming region is alkylated and substituted with, for example, the methyl (—$CH_3$) group by the surface modification treatment. The color filter forming region shows high wettability with respect to a color filter forming material including a hydrocarbon based dispersion medium, for example. Thus, the color filter forming material disposed to the color filter forming region is repelled on the upper surface of the bank on which the lyophobic treatment has been performed, favorably wetting and spreading in the color filter forming region that shows high wettability.

As a result, a highly reliable color filter with uniform thickness can be formed since the color filter forming material smoothly flows in the color filter forming region. That is, the liquid crystal display provided with the color filter has high reliability.

A method for manufacturing a liquid crystal display provided with a conductive film pattern in a region partitioned by a bank according to a third aspect of the invention includes: forming a bank film on a substrate; performing a lyophobic treatment on a surface of the bank film; patterning the bank film on which the lyophobic treatment has been performed to form the bank; performing a surface modification treatment in which a hydroxyl group on a surface of a conductive film pattern forming region partitioned by the bank is alkylated; disposing a conductive functional liquid in the conductive film pattern forming region; and firing the conductive functional liquid to form the conductive film pattern.

According to the method, the hydroxyl (—OH) group on the surface of the conductive film pattern forming region is alkylated and substituted with, for example, the methyl (—$CH_3$) group by the surface modification treatment. The conductive film pattern forming region shows high wettability with respect to a conductive functional liquid including a hydrocarbon based dispersion medium, for example. Thus, the conductive functional liquid disposed to the conductive film pattern forming region is repelled on the upper surface of the bank on which the lyophobic treatment has been performed, favorably wetting and spreading in the conductive film pattern forming region that shows high wettability.

As a result, a highly reliable conductive pattern with uniform thickness can be formed since the conductive functional liquid smoothly flows in the conductive film pattern forming region. The conductive film pattern can be employed, for example, wiring lines and transparent electrodes in the liquid crystal display. As a result, the liquid crystal display provided with the conductive film pattern has high reliability.

BRIEF DESCRIPTION OF DRAWINGS

The invention will be described with references to the accompanying drawings, wherein like numbers reference like elements.

FIGS. 1A through 1E show the method for forming a pattern according to a first embodiment of the invention.

DESCRIPTION OF EXEMPLARY EMBODIMENTS

Figure 2:
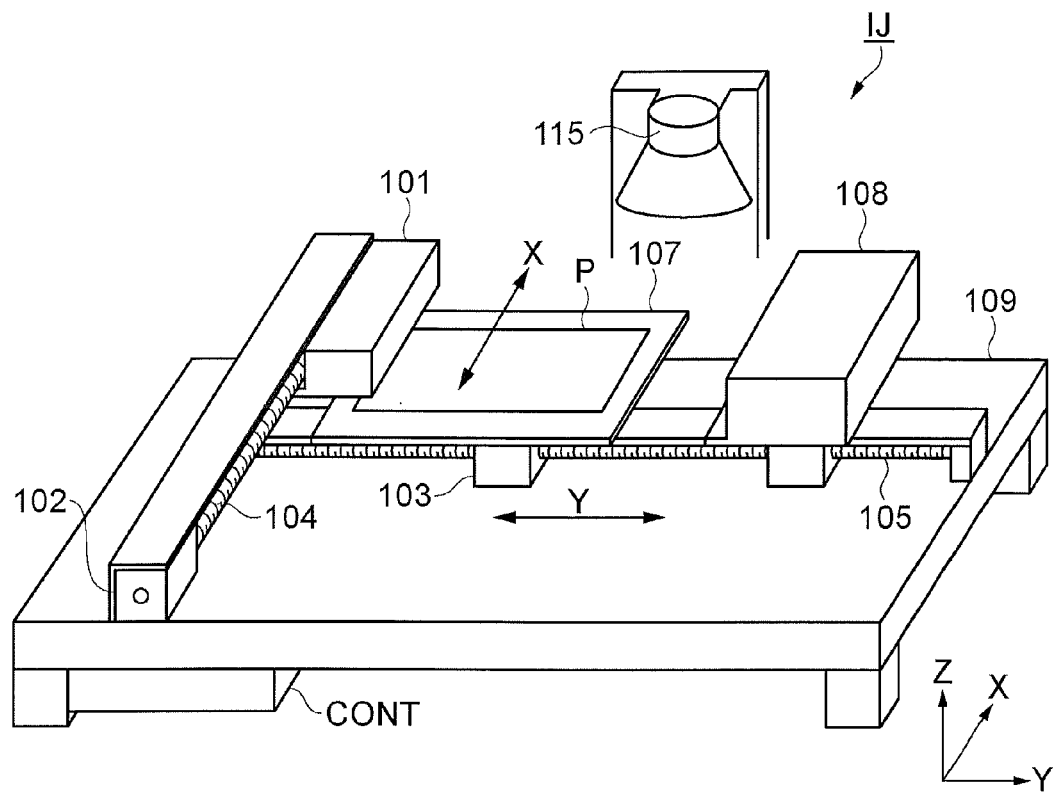
FIG. 2 is a schematic perspective view of a droplet discharge device.

Embodiments of the invention will now be described, with reference to drawings. First, a method for forming a pattern according to a first embodiment of the invention will be described.

First Embodiment

Method for Forming a Pattern

First, a bank film, which is a material to form a bank, is formed on a substrate. In the first embodiment, a treatment is carried out in order to improve adhesiveness between the bank film and a substrate P prior to form the bank film. Specifically, an HMDS treatment is carried out to the substrate P for about 120 seconds as shown in FIG. 1A. In the HMDS treatment, the surface of the substrate P is exposed to a vapor of hexamethyldisilazane (($CH_3)_3$SiNHSi($CH_3)_3$). The substrate P is heated (heating condition: at 95° C. and for 60 seconds) using a hot plate.

Through the above step, a HMDS layer (not shown) to improve adhesiveness between the bank and the substrate P is formed on the substrate P. The HMDS layer is formed by substituting a hydroxyl (—OH) group on the surface of the substrate P with a methyl (—CH$_3$) group.

In this regard, if all of the hydroxyl (—OH) groups on the surface of the substrate are substituted with the methyl (—CH$_3$) group, the adhesiveness between a bank film B$_0$ and the substrate P cannot be thoroughly achieved. Thus, the HMDS treatment is carried out so as to achieve a state in which the hydroxyl (—OH) group and the methyl (—CH$_3$) group are mixed on the surface of the substrate P. As a result, the bank film B$_0$ can be formed on the substrate P with they closely contacted.

After the HMDS treatment, the bank film B$_0$ is formed on the substrate P up to the height of the bank as shown in FIG. 1B by using a predetermined method such as spin coating, spray coating, roll coating, die coating, and dip coating. Then, the bank film B$_0$ formed on the substrate P is pre-baked (drying condition: at 95° C. and for 60 seconds) by using a hot plate.

Examples of a material of the substrate P include glass, quartz glass, a Si wafer, a plastic film, and a metal plate. Such examples may also include the above material substrates whose surfaces are provided with a base layer such as a semiconductor film, a metal film, a dielectric film, and an organic film. This embodiment uses a glass substrate as the substrate P.

As a material to form the bank film B$_0$, both organic materials including a polymer material such as an acrylic resin, a polyimide resin, an olefin resin, and a melamine resin and inorganic materials can be used. Inorganic materials are preferably used in terms of heat resistance.

Examples of such inorganic materials include: polymer inorganic materials and photosensitive inorganic materials containing silicon in the skeleton such as polysilazane, polysiloxane, siloxane resists, and polysilane resists; spin-on glass films including any of silica glass, alkylsiloxane polymer, alkylsilsesquioxane polymer, alkylsilsesquioxane hydride polymer, and polyarylether; diamond films and fluorinated amorphous carbon films. In addition, aerogel and porous silica can be used as the inorganic material to form a bank.

In the embodiment, particularly, photosensitive polysilazane, which is an inorganic material mainly containing polysilazane, is used for the bank film B$_0$. Photosensitive polysilazane includes a photosensitive polysilazane composition that contains polysilazane and a photoacid generator, and functions as a positive type. As a result, the bank film B$_0$ can be directly patterned by exposure and development treatments, whereby a bank B is formed. Details will be described later.

After the bank film B$_0$ is formed on the substrate P, the surface of the bank film B$_0$ is subjected to a lyophobic treatment as shown in FIG. 1C. Specifically, in the embodiment, a fluororesin material (PVDF, PTFE) F, such as EGC-1700 and EGC-1720 (diluted 2:1) manufactured by Sumitomo 3M Ltd., is coated on the bank film B$_0$ by spin coating. Then, the fluororesin material F is pre-baked (drying condition: at 95° C. and for 60 seconds) by using a hot plate. The fluororesin material F gives the surface of the bank film B$_0$ lyophobicity with respect to a functional liquid disposed in a region partitioned by the bank. Various methods such as spray coating, roll coating, die coating, dip coating, and an inkjet method can be applied to the step for coating the fluororesin material F.

As the lyophobic treatment, for example, a plasma treatment method (CF$_4$ plasma treatment method) can be employed that is carried out in the atmosphere by using tetrafluoromethane as a process gas. The CF$_4$ plasma treatment is carried out, for example, under the following condition: plasma power is from 50 W to 1000 W; a tetrafluoromethane gas flow rate is from 50 ml/min to 100 ml/min; a substrate transportation velocity with respect to a plasma discharge electrode is from 0.5 mm/sec to 1020.0 mm/sec; and a substrate temperature is from 70° C. to 90° C. The process gas is not limited to tetrafluoromethane (tetrafluorocarbon), but other fluorocarbon gases can also be used. Other than the plasma treatment, reduced-pressure plasma methods and vapor phase treatment methods with FAS can be used.

Next, the bank film B$_0$ is exposed by using a mask as shown in FIG. 1D. Then, the bank film B$_0$ is humidified and developed as shown in FIG. 1E. The process in which the development is carried out after the humidification allows nitrogen elements, which are factors to reduce a light transmittance, in the bank film B$_0$ to be eliminated. The exposure condition is, for example, 10 mj. The humidification condition is as follows: temperature is 25° C., humidity is 80% RH, and humidification time is 4 minutes. The development condition is as follows: temperature is 25° C., development time is 1 minute, and TMAH 2.38% is used as a developer. After the development, a dewatering treatment may be carried out if necessary. The dewatering treatment is carried out by leaving the substrate P in vacuum for 5 minutes, for example.

Through the above steps, the bank film B$_0$ is patterned, whereby the bank B is formed on the substrate P. The region partitioned by the bank B serves as a pattern forming region 34.

Next, a surface modification treatment is carried out to the substrate P on which the bank B has been formed. In the surface modification treatment, the hydroxyl (—OH) group on the surface of the pattern forming region 34 partitioned by the bank B is alkylated (methylated).

Specifically, in the embodiment, the HMDS treatment is carried out to the substrate P on which the bank has been formed for 120 seconds as the surface modification treatment. In the HMDS treatment, the hydroxyl (—OH) group on the surface of the pattern forming region 34 partitioned by the bank B is substituted with the methyl (—CH$_3$) group. The surface includes the side surface of the bank B and the surface of the substrate P exposed in an area partitioned by the bank B. As described above, the HDMS treatment in forming the bank film B$_0$ leaves the surface of the substrate P in a state in which the hydroxyl (—OH) group and the methyl (—CH$_3$) group are mixed.

Therefore, the surface modification treatment (HMDS treatment) substitutes the hydroxyl (—OH) group that remains on the surface of the substrate P exposed in the area partitioned by the bank B with the methyl (—CH$_3$) group. As a result, the methyl (—CH$_3$) group is given on the side surface of the bank B that partitions the pattern forming region 34 and the surface of the substrate P exposed in the area partitioned by the bank B by the surface modification treatment.

After the surface modification treatment, a step is carried out in which a functional liquid (ink) is disposed in the pattern forming region 34. Various kinds of functional liquids (ink) can be used in the invention.

The functional liquid includes ones that can form a film having a predetermined function (functional film) by turning a film component contained in the liquid into the film. Examples of such functions include: electric and electronic functions (e.g. conductive, insulating, piezoelectric, pyroelectric, and dielectric properties); optical functions (e.g.

photoselective absorption, reflectivity, polarization, photoselective transmission, nonlinear optical properties, luminescence such as fluorescence and phosphorescence, and photochromic properties); magnetic functions (e.g. hard magnetism, soft magnetism, nonmagnetism, and permeability); chemical functions (e.g. absorption, desorption, catalysis, water absorption, ion conductivity, oxidation-reduction properties, electrochemical characteristics, and electrochromic properties); mechanical functions (e.g. abrasion resistance); thermal functions (e.g. thermal conductivity, thermal insulation, and infrared radiation); and biological functions (e.g. biocompatibility, and antithrombogenicity). In the embodiment, a functional liquid is used that contains conductive fine particles and used for forming wiring lines, for example.

As for the method for disposing the functional liquid in the pattern forming region 34, a droplet discharge method, so called a inkjet method, is preferably used. Using the droplet discharge method has an advantage that liquid material is consumed with little waste and the volume and position of functional liquid disposed on a substrate is easily controlled compared to other coating technique such as spin coating.

The functional liquid for forming a wiring line is a dispersion liquid in which conductive fine particles are dispersed in a dispersion medium. As the conductive fine particles, for example, metal fine particles including any of gold, silver, cupper, palladium, manganese, nickel, and oxides thereof, and fine particles of a conductive polymer, a super-conductive material and the like are used. In the embodiment, manganese is used as a conductive fine particle.

These conductive fine particles may be used by coating their surfaces with organic matter or the like to improve their dispersibility. As the coating material coated on the surface of the conductive fine particle, organic solvent such as xylene and toluene, citric acid and the like are used.

The diameter of the conductive fine particle is preferably in the range from 1 nm to 0.1 μm. Particles having a diameter larger than 0.1 μm may cause clogging of a discharge nozzle included in a droplet discharge head, while particles having a diameter smaller than 1 nm may make the volume ratio of a coated material to the particles so large that the ratio of organic matter in the resulting film becomes excessive.

As the dispersion medium, a hydrocarbon based one is particularly used that is capable of dispersing the above conductive fine particles. The following hydrocarbon compounds can be exemplified: n-heptane, n-octane, decane, dodecane, tetradecane, toluene, xylene, cymene, durene, indene, dipentene, tetrahydronaphthalene, decahydronaphthalene, and cyclohexylbenzene. The hydrocarbon compounds are superior in terms of dispersibility of a fine particle, stability of a dispersion medium, and applicability to a droplet discharge method (inkjet method).

The pattern forming region 34, the surface of which has the substituted methyl (—$CH_3$) group, shows significantly high wettability with respect to a functional liquid (ink) containing such hydrocarbon based dispersion medium, and shows lyophilicity.

In contrast, the upper surface of the bank B that partitions the pattern forming region 34 shows lyophobicity with respect to the above functional liquid since the fluororesin material F is formed.

Accordingly, even if the region partitioned by the bank B (pattern forming region 34) is fine, the functional liquid is repelled on the upper surface of the bank B, smoothly flowing in the pattern forming region 34.

The surface tension of the functional liquid is preferably in the range from 0.02 N/m to 0.07 N/m inclusive. If the surface tension is below 0.02 N/m when the liquid is discharged by using the droplet discharge method, the wettability of the ink composition with respect to a surface of a discharge nozzle is increased, easily causing a flight curve, while if the surface tension exceeds 0.07 N/m, a meniscus shape at the tip of the nozzle is unstable, rendering the control of the discharge amount and discharge timing problematic. In order to adjust the surface tension, a fluorine-, silicone- or nonionic-based surface tension adjuster, for example, may be added in a small amount to the dispersion liquid in a range not largely lowering a contact angle with respect to a substrate. The nonionic surface tension adjuster enhances the wettability of a liquid with respect to a substrate, improves the leveling property of a film, and serves to prevent minute concavities and convexity of the film from being generated. The surface tension adjuster may include, if necessary, organic compounds, such as alcohol, ether, ester, and ketone.

The viscosity of the dispersion liquid is preferably within the range from 1 mPa·s to 50 mPa·s inclusive. When a liquid material is discharged as a droplet by using a droplet discharge method, ink having a viscosity lower than 1 mPa·s may contaminate the periphery of the nozzle due to ink leakage. Ink having a viscosity higher than 50 mPa·s may possibly cause nozzle clogging, making it difficult to discharge droplets smoothly.

As discharging techniques of the method for discharging a droplet, a charge control method, a pressurized vibration method, an electromechanical converting method, an electrothermal converting method, and an electrostatic attraction method are exemplified. In the charge control method, electric charges are applied to a material by a charge electrode. The material is discharged from a nozzle by controlling a flying direction of the material with a deflecting electrode. The pressurized vibration method is the method in which ultra-high pressure of approximately 30 kg/cm$^2$ is applied to a material so as to discharge the material at the tip of a nozzle. If no control voltage is applied, the material moves straight ahead so as to be discharged from a discharge nozzle. If a control voltage is applied, electrostatic repelling occurs in the material so as to disperse the material, whereby no material is discharged from the nozzle. Also, the electromechanical converting method utilizes the characteristic of a piezo element (piezoelectric element) that it is deformed in response to a pulsed electric signal. In the method, the deformation of the piezo element applies pressure, via an elastic material, to a space storing a material, pushing the material out of the space to discharge it from a discharge nozzle.

In the electrothermal conversion method, bubbles are produced by rapidly evaporating a material with a heater provided in a space storing the material, and the material in the space is discharged by the pressure of bubbles. In the electrostatic attraction method, micro pressure is applied to a space storing a material so as to form a meniscus of the material at a discharge nozzle, and then electrostatic attraction is applied so as to pull out the material. Other than the methods, a method that uses a fluid viscosity change caused by an electric field, and a method that uses electric discharge sparks can also be employed. The droplet discharge method has an advantage that a desired amount of a material can be adequately disposed to a desired location with little waste of the material. The amount of one droplet of liquid material (fluid) discharged by the droplet discharge methods is, for example, from 1 nanogram to 300 nanograms.

According to the method for forming a pattern of the embodiment, a pattern having conductivity can be formed by using the above functional liquid for forming a wiring line. The conductive pattern is applied to devices as a wiring line.

FIG. 2 is a perspective view illustrating a schematic structure of a droplet discharge device (inkjet device) IJ that disposes a liquid material on a substrate by a droplet discharge method as an example of devices used for the method for forming a pattern of the embodiment.

The droplet discharge device IJ includes a droplet discharge head 101, an X-axis direction drive axis 104, a Y-axis direction guide axis 105, a controller CONT, a stage 107, a cleaning mechanism 108, a base 109, and a heater 115.

The stage 107, which supports a substrate P to which ink (a liquid material) is provided by the droplet discharge device IJ, includes a fixing mechanism (not shown) for fixing the substrate P at a reference position.

The droplet discharge head 101 is a multi-nozzle type droplet discharge head including a plurality of discharge nozzles. The longitudinal direction of the head 301 coincides with the X-axis direction. The plurality of discharge nozzles is disposed on a lower surface of the droplet discharge head 101 in the X-axis direction by a constant interval. The ink containing the above conductive fine particles is discharged from the discharge nozzles included in the droplet discharge head 101 to the substrate P supported by the stage 107.

The X-axis direction drive axis 104 is connected to an X-axis direction drive motor 102. The X-axis direction drive motor 102 is a stepping motor, for example, and rotates the X-axis direction drive axis 104 when a driving signal in the X-axis direction is supplied from the controller CONT. The X-axis direction drive axis 104 rotates so as to move the droplet discharge head 101 in the X-axis direction.

The Y-axis direction guide axis 105 is fixed so as not to move with respect to the base 109. The stage 107 is equipped with a Y-axis direction drive motor 103. The Y-axis direction drive motor 103 is a stepping motor, for example, and moves the stage 7 in the Y-axis direction when a driving signal in the Y-axis direction is supplied from the controller CONT.

The controller CONT supplies the droplet discharge head 101 with a voltage for controlling a droplet discharge. The controller CONT also supplies the X-axis direction drive motor 102 with a drive pulse signal for controlling the movement of the droplet discharge head 101 in the X-axis direction, and the Y-axis direction drive motor 103 with a drive pulse signal for controlling the movement of the stage 107 in the Y-axis direction.

The cleaning mechanism 108 cleans the droplet discharge head 101. The cleaning mechanism 108 is equipped with a drive motor (not shown) for Y-axis direction. By driving the Y-axis direction drive motor, the cleaning mechanism 108 is moved along the Y-axis direction guide axis 105. The controller CONT also controls the movement of the cleaning mechanism 108.

The heater 115, which is means to subject the substrate P under a heat treatment by a lamp annealing in this case, evaporates and dries solvents contained in a liquid material coated on the substrate P. The controller CONT also controls turning on and off the heater 115.

The droplet discharge device IJ discharges droplets to the substrate P while relatively scanning the droplet discharge head 101 and the stage 107 supporting the substrate P. In the following description, the Y-axis direction is referred to as a scan direction and the X-axis direction perpendicular to the Y-axis direction is referred to as a non-scan direction. Accordingly, the discharge nozzles of the droplet discharge head 101 align in the X-axis direction or the non-scanning direction with a given space between two adjacent discharge nozzles. While the droplet discharge head 101 is disposed at right angle to the moving direction of the substrate P in FIG. 2, the angle of the droplet discharge head 101 may be adjusted so as to intersect the moving direction of the substrate P. Accordingly, a pitch between the nozzles can be adjusted by adjusting the angle of the droplet discharge head 101. Alternatively, the distance between the substrate P and a nozzle surface may be arbitrarily adjusted.

Figure 3:
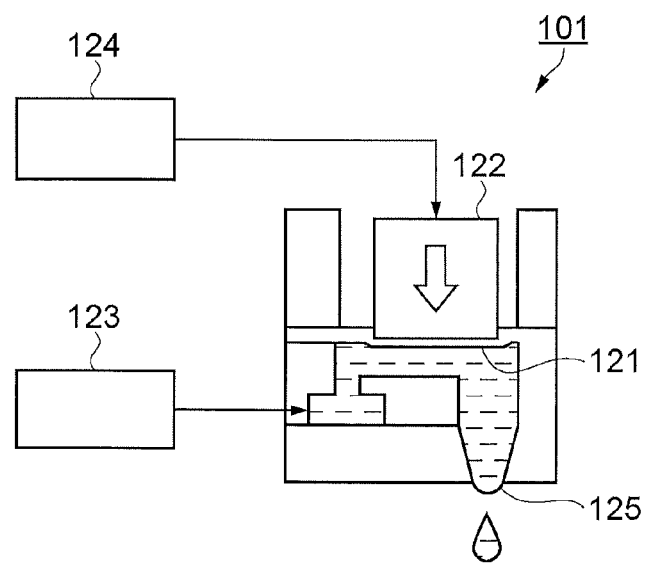
FIG. 3 is a view describing a discharge principle of a liquid by a piezoelectric method.

FIG. 3 is a diagram for explaining a discharge principal of a liquid material by a piezoelectric method.

In FIG. 3, a piezo element 122 is disposed adjacent to a liquid chamber 121 storing a liquid material (ink for a wiring pattern or functional liquid). To the liquid chamber 121, a liquid material is supplied through a liquid material supply system 123 including a material tank that stores the liquid material.

The piezo element 122 is connected to a driving circuit 124. A voltage is applied to the piezo element 122 through the driving circuit 124 so as to deform the piezo element 122, thereby the liquid chamber 121 is deformed to discharge the liquid material from a nozzle 25. In this case, a strain amount of the piezo element 122 is controlled by changing a value of applied voltage. In addition, a strain velocity of the piezo element 122 is controlled by changing a frequency of applied voltage. The droplet discharge employing this piezoelectric method has an advantage that the method hardly gives an effect on a material composition since no heat is applied to the material.

Here, the bank B formed on the substrate P and the functional liquid disposed in the pattern forming region 34 need a firing treatment. The firing step of the bank B and the functional liquid may be carried out together in the same step, or individually (separately).

A collective firing and a separate firing will be described below.

Collective Firing

First, a case of the collective firing will be descried. As described above, in the collective firing, the firing step of the bank B and the functional liquid disposed in the pattern forming region 34 are carried out collectively in the same step. The collective firing can omit the firing step of the bank, realizing reduction of processing time in a pattern forming step.

Figure 4A:
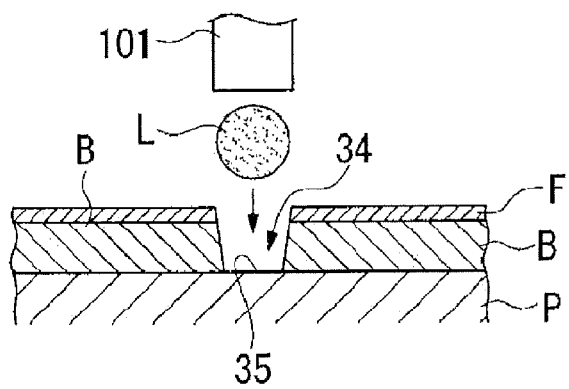
FIGS. 4A through 4D show steps for forming a pattern in a collective firing.
Figure 4B:
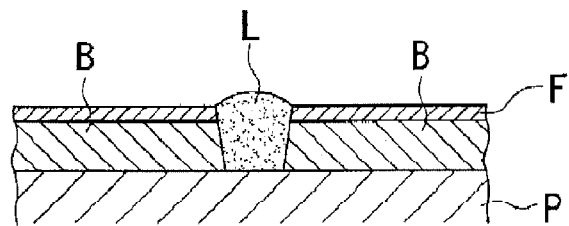

First, the functional liquid is disposed in the pattern forming region 34 by using the droplet discharge method with the droplet discharge device IJ shown in FIG. 2. Specifically, as shown in FIG. 4A, a functional liquid L containing a material for forming a wiring pattern is disposed in a form of droplets from the droplet discharge head 101. The discharged droplets are disposed in the pattern forming region 34 that has a groove shape and partitioned by the bank B on the substrate P as shown in FIG. 4B. The droplet can be discharged by the following conditions as an example: the ink weight is from 4 ng/dot to 7 ng/dot, and the ink velocity (discharge velocity) is from 5 m/sec to 7 m/sec. The ambient atmosphere for discharging a droplet is preferably set at a temperature of 60° C. or less, and a humidity of 80% or less. This condition allows the discharge nozzles of the droplet discharge head 101 to stably discharge droplets without clogging.

Since the pattern forming region 34 in which droplets are discharged is surrounded by the bank B, it is possible to prevent the droplets from flowing and spreading out of a predetermined area.

In addition, since lyophobicity is given to the upper surface of the bank B by the fluororesin material F, even if part of the discharged droplets is placed on the bank B, the droplets are repelled and flowed down to the pattern forming region 34 that has a groove shape and partitioned by the bank B.

Further, the discharged droplets (the functional liquid L containing a hydrocarbon based dispersion medium) spread in and are uniformly formed in the pattern forming region 34 since the methyl (—CH$_3$) group is given on the surface of the substrate P, which is exposed at a bottom 35 of the pattern forming region 34, and the side surface of the bank B.

Figure 4C:
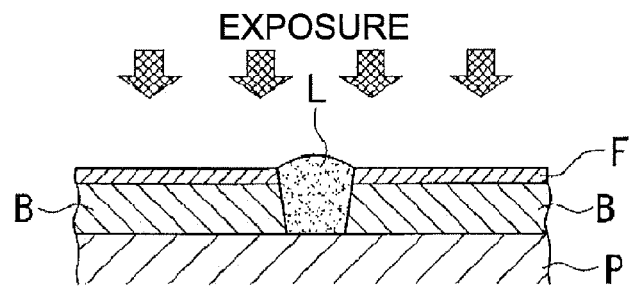

Next, the substrate P is entirely exposed as shown in FIG. 4C. The exposure prior to a firing treatment, which will be described later, enhances the leaving reaction of the hydroxyl (—OH) group in the bank forming material.

Then, the substrate P is dried by using a hot plate at 120° C. for 2 minutes. Other than the hot plate, an electric furnace and lamp annealing can be used as a post baking. Examples of light sources used for lamp annealing are not particularly limited, and may include infrared lamps, xenon lamps, YAG laser, argon laser, carbon dioxide laser, and excimer laser of XeF, XeCl, XeBr, KrF, KrCl, ArF and ArCl.

Firing Treatment

The dispersion medium in dried functional film needs thoroughly removing in order to make electrical contact between fine particles secured. If a coating material such as organic matter is coated on the surface of a conductive fine particle in order to improve the dispersibility, the coating material needs removing. For this purpose, the substrate P is subjected to heat and/or light treatment after droplets are discharged (firing treatment). The firing treatment is carried out at 220° C. for 30 minutes.

The heat treatment and/or the light treatment is usually carried out in the atmosphere. If necessary, they can also be carried out in an environment of inactive gas such as nitrogen, argon, and helium. The temperature of the heat and/or light treatment is appropriately set depending on the boiling point (vapor pressure) of the dispersion medium, the type and pressure of atmospheric gas, thermal behavioral properties including fine particle dispersibility and oxidizability, the presence and volume of the coating material, base-material heat resistance temperature, and the like. For example, the firing treatment needs to be carried out at about 300° C. to eliminate a coating material made of organic matter. In this case, low melting point glass may be preliminary coated on the bank B and the dried liquid film, for example.

As the result of the heat treatment, the bank B (the bank film B$_0$) is fired, turning to a structure of a siloxane skeleton since the material for forming the bank B (the bank film B$_0$) mainly contains polysilazane in the embodiment as described above.

For example, when polysilaxane-polymethylsilaxane (—(SiCH$_3$(NH)$_{1.5}$)$_n$—)— is used as a material for forming a bank, polymethylsilaxane is partially hydrolyzed by a humidification treatment, turning to SiCH$_3$(NH)(OH). Then, it is condensed by firing, turning to polymethylsiloxane (—(SiCH$_3$O$_{1.5}$)—). Polymethylsiloxane formed as described the above shows high resistance to heat treatment since its skeleton, which is major component, is an inorganic substance. When plastic is used for the substrate P, the firing is preferably carried out in the temperature range from room temperature to 100° C. inclusive.

Figure 4D:
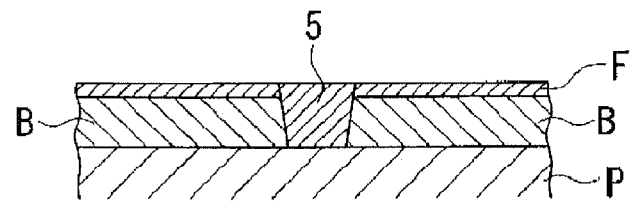

Trough the above steps, the functional liquid L turns in a wiring line (pattern) 5 shown in FIG. 4D with electrical contact secured between fine particles.

Here, a pattern having a thick thickness can be formed by repeating the drying treatment and the step to dispose a functional liquid so as to layer droplets of the functional liquid in a multiple numbers on the substrate P. In addition, a high-performance wiring line in which deferent materials are layered in a multiple numbers may be formed by discharging another functional liquid containing a different conductive fine particle on the substrate P between the drying treatment and the firing treatment.

While photosensitive polysilazane that includes the material mainly containing polysilazane and the photoacid generator is used as the material for forming the bank film B$_0$ in the embodiment, photosensitive polysiloxane that includes polysiloxane and a photoacid generator may be used as the material for forming a bank. This material does not need the humidification treatment carried out in the embodiment. The reason is that the humidification is not required since polysiloxane contains no nitrogen element while the humidification has an effect to remove the nitrogen element when polysilazane is used as the main element of a material for forming a bank. Therefore, the humidification step can be omitted, whereby waiting time during which the substrate P is humidified can be eliminated. As a result, productivity can be increased.

Separate Firing

Next, a case of the separate firing will be descried. In the separate firing, the firing steps of the bank B and the functional liquid L disposed in the pattern forming region 34 are separately carried out. Specifically, after the firing treatment of the bank B, the firing treatment of the functional liquid L is carried out.

Figure 5A:
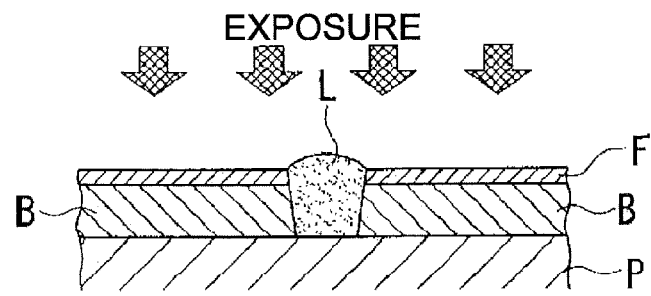
FIGS. 5A through 5D show steps for forming a pattern in a separate firing.
Figure 5B:
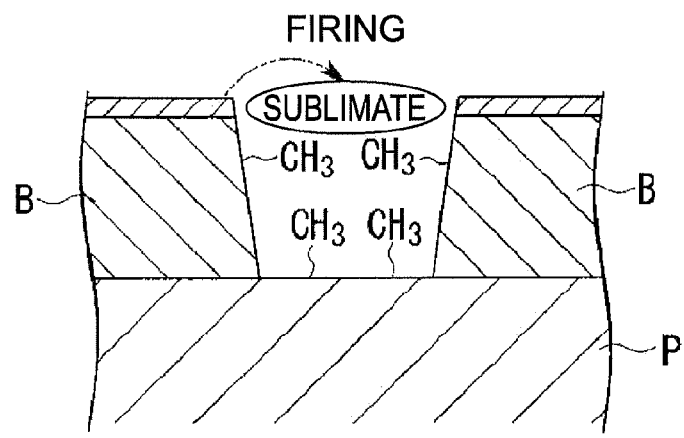
Figure 5C:
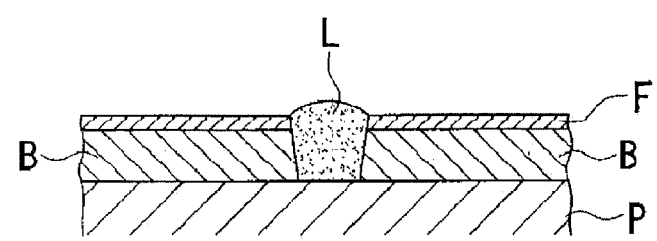

First, the substrate P is entirely exposed as shown in FIG. 5C. This exposure can enhance the leaving reaction of the hydroxyl (—OH) group in the bank forming material. Then, the bank B is fired at 220° C. for 10 minutes as shown in FIG. 5B. As the result of this firing treatment, the material forming the bank B (the bank film B$_0$) is fired, turning to a structure of a siloxane skeleton. Specifically, the bank B is structured by polymethylsiloxane (—(SiCH$_3$O$_{1.5}$)—).

Here, lyophobicity is given on the upper surface of the bank B by forming the fluororesin material F as a film, as described above. If the firing treatment is carried out to the bank B as structured above, sublimates produced from the fluororesin material F by thermally decomposing may adhere in the pattern forming region 34 by being bonded to the hydroxyl (—OH) group.

The sublimates lower the wettability in the pattern forming region 34, and hinders favorable wiring lines (patterns) from being formed in the pattern forming region 34. Therefore, the sublimates bring about a problem especially in a case when the bank B is fired prior to the step to dispose a functional liquid such as the separation firing. In order to form favorable patterns, the sublimates are required to be removed by cleaning with hydrofluoric acid (HF), making the step cumbersome.

However, in the method for forming a pattern of the embodiment, the hydroxyl (—OH) group, to which the sublimates are easily bonded, in the pattern forming region 34 is substituted with the methyl (—CH$_3$) group by the surface modification treatment, preventing the sublimates from adhering to the pattern forming region 34 by being bonded to the hydroxyl (—OH) group. Therefore, the above hydrofluoric acid cleaning step for removing sublimates is eliminated. The step in forming a pattern can be simplified and favorable wiring lines (patterns) can be formed in the pattern forming region 34.

Then, the functional liquid is disposed in the pattern forming region 34 by using the droplet discharge method with the droplet discharge device IJ shown in FIG. 2.

In the embodiment, the functional liquid L, which is the same liquid as is used in the collective firing, is used and discharged from the droplet discharge head 101 as a droplet. The discharged droplets are disposed in the pattern forming region 34 partitioned by the bank B on the substrate P as shown in FIG. 5C. The droplet is discharged in the same manner of the collective firing with the following conditions:

the ink weight is from 4 ng/dot to 7 ng/dot, and the ink velocity (discharge velocity) is from 5 m/sec to 7 m/sec. In addition, an ambient condition for discharging a droplet is set as follows: temperature is 60° C. or less and humidity is 80% or less. The condition allows the discharge nozzles of the droplet discharge head 101 to stably discharge a droplet without clogging.

Since the pattern forming region 34 in which droplets are discharged is surrounded by the bank B, it is possible to prevent the droplets from flowing and spreading out of a predetermined area.

In addition, since lyophobicity is given to the upper surface of the bank B by the fluororesin material F, even if part of the discharged droplets is placed on the bank B, the droplets are repelled and flowed down to the pattern forming region 34 partitioned by the bank B.

Further, the discharged droplets (the functional liquid L containing a hydrocarbon based dispersion medium) spread in and are uniformly formed in the pattern forming region 34 since the methyl ($-CH_3$) group is given on the surface of the substrate P, which is exposed at the bottom of the pattern forming region 34, and the side surface of the bank B.

Next, the functional liquid L disposed in the pattern forming region 34 is dried by using a hot plate, for example. The dried functional film (functional liquid) is subjected to a heat and/or light treatment (firing treatment) in order to thoroughly remove the dispersion medium. The firing treatment is carried out at 220° C. for 30 minutes.

The bank B structured by polymethylsiloxane has high resistance to heat treatment since the skeleton, which is major component, of polymethylsiloxane is an inorganic substance. Further, the difference in thermal expansion rate between the bank B and the substrate P is lessened in addition to the above. Therefore, the deterioration of the bank B due to heat in drying the functional liquid L and firing is suppressed, whereby patterns can be formed in a favorable shape. The firing temperature may be 300° C. or more in a case where a functional liquid is fired after low melting point glass is coated on the bank B and the functional liquid, or firing treatment is carried out in order to remove or fire the coating material on particles. Even in such cases, the bank B is durable enough since the bank B is structured by the inorganic material.

Figure 5D:
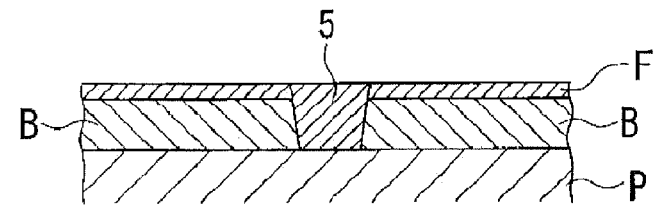

As described above, the method for forming a pattern of the embodiment can prevent impurities from being produced in the pattern forming region 34 even when the bank B and a functional liquid are separately fired. As a result, the wiring line (pattern) 5 can be favorably formed in the pattern forming region 34 as shown in FIG. 5D.

Second Embodiment

Next, a second embodiment of the invention will now be described with reference to FIG. 6. The second embodiment uses the method for forming a pattern of the first embodiment. In the second embodiment, the same members and elements as those in the first embodiment will be given the same reference numerals as those therein, and further description thereof will be omitted.

The method for forming a pattern in the embodiment includes a bank forming step to form the bank B on the substrate P, and a material disposing step to dispose the functional liquid L to a pattern forming region A that has a line shape and partitioned by the bank B. The bank forming step employs the method of the first embodiment.

In the method for forming a pattern of the embodiment, the functional liquid L is disposed in the pattern forming region A that has a line shape and partitioned by the bank B, dried to form the wiring line 5 on the substrate P. In this case, the wiring line 5 can be made finer or narrowed by adequately forming the bank B as exemplary shown in FIG. 6 in which the width between adjacent banks B is narrowed since the bank B partitions the wiring line 5. In addition, the side surface of the bank B, which is formed by the method of the first embodiment, has the substituted methyl group thereon, showing lyophilicity with respect to the functional liquid L. The functional liquid L can smoothly flows in a region partitioned by the bank B with a capillary phenomenon even if the width between banks B is narrowed. Here, the bank B may be removed from the substrate P or remain as it is after the wiring line 5 is formed.

Further, in the method for forming a pattern of the embodiment, a part of the width is widened in the pattern forming region A that has a line shape and partitioned by the bank B, when the bank B is formed on the substrate P. That is, a part having a width Wp wider than the width W of other regions (Wp>W) is provided singly or in a plurality at a predetermined position in the axis direction of the pattern forming region A. The part is hereinafter referred to as a wide width part As when needed.

Since the width of the pattern forming region A partitioned by the bank B is partially widened (the wide width part As) in the method for forming a pattern of the embodiment, a portion of the functional liquid L flows in the wide width part As when the functional liquid L is disposed. As a result, the functional liquid L can be prevented from flowing out of the bank B.

In general, when liquid is disposed in a region partitioned by the bank B, a case may occur in which the liquid hardly flows into or spread in the region due to the action of surface tension of the liquid or the like. In contrast, according to the method for forming a pattern of the embodiment, a liquid movement at a part in which lines having a different width meet triggers and enhances the movement of a functional liquid flowing and spreading in the pattern forming region A. As a result, the functional liquid can be prevented from flowing out of the bank B. Obviously, the amount of a functional liquid to be discharged to the pattern forming region A is adequately set when the functional liquid L is disposed.

In the method for forming a pattern of the embodiment, since the functional liquid L can be prevented from flowing out of the bank B when the functional liquid L is disposed as described above, the wiring line 5 can be accurately formed in a desired shape. As a result, the wiring line 5 having a narrowed width can be accurately and stably formed.

In addition, lyophobicity is only given to the upper surface of the bank B and lyophilicity is given to the pattern forming region A by the alkylation (methylation) in the surface modification treatment since the bank B is formed by the method of the first embodiment in the embodiment. Thus, the functional liquid L can smoothly flow into a region partitioned by the bank B, improving film uniformity even when the wiring line 5 having a fine shape is formed.

Here, the ratio of the width Wp of the wide width part As to the width W of other regions is preferably from 110% to 500% in the pattern forming region A partitioned by the bank B. The above range can reliably prevent the functional liquid L from flowing out of the bank B when the functional liquid L is disposed. If the ratio is less than 110%, it is unfavorable because the functional liquid may not thoroughly flow in the wide width area. If the ratio is more than 500%, it is unfavorable in terms of the space efficiency on the substrate P.

Figure 6:
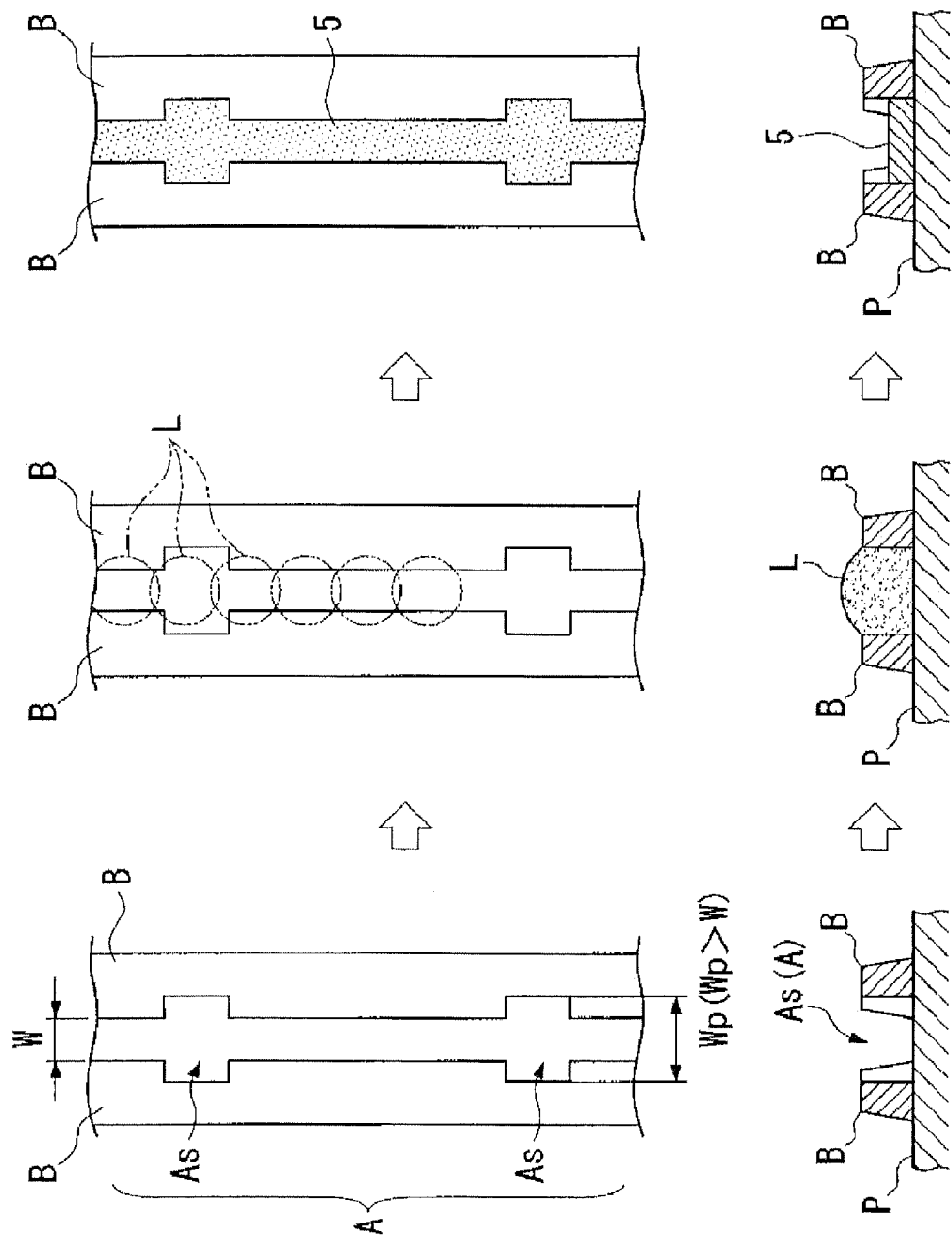
FIG. 6 illustrates the method for forming a pattern of a second embodiment of the invention.

The shape of the pattern forming region A is not limited to that shown in FIG. 6. The arrangement of the wide width part As—number of pieces, size, position, pitch, and the like—in the pattern forming region A is adequately set corresponding to the material or the width of a pattern, or desired accuracy.

Third Embodiment

Next, a third embodiment according to the invention will now be described with reference to FIGS. 7, 8A and 8B. The third embodiment uses the method for manufacturing a pattern of the first embodiment. In the third embodiment, the same members and elements as those in the first and the second embodiments will be given the same reference numerals as those therein, and further description thereof will be omitted.

Figure 7:
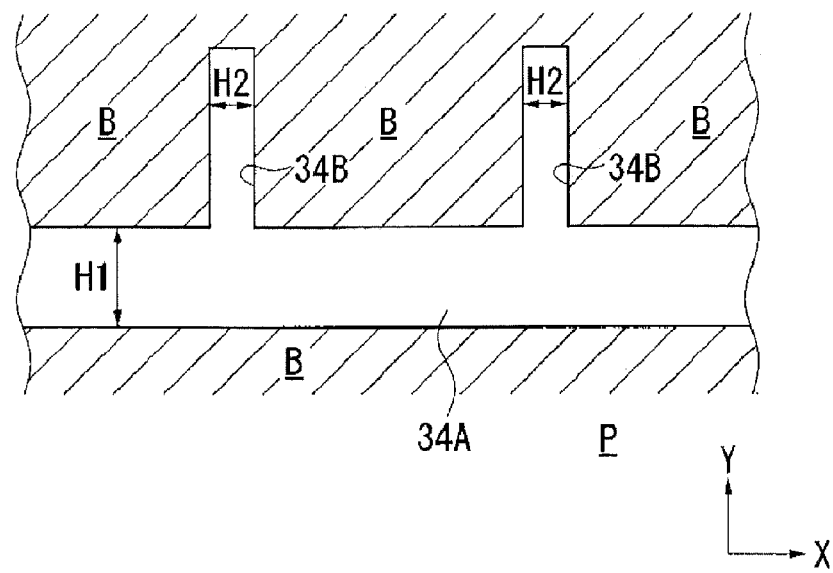
FIG. 7 illustrates the method for forming a pattern of a third embodiment of the invention.

In FIG. 7, a first groove part 34A (wide width part) that has a first width H1 and partitioned by the bank B and a second groove part 34B (narrow width part) that has a second width H2 and connects to the first groove part 34A are formed on the substrate P. The first width H1 is larger than the diameter of a flying droplet of a functional liquid. The second width H2 is narrower than the first width H1. In other words, the second width H2 is smaller than the first width H1. In FIG. 7, the first groove part 34A is formed so as to extend in the X-axis direction while the second groove part 34B is formed so as to extend in the Y-axis direction different from the X-axis direction. The bank B is formed by the method of the first embodiment.

Figure 8A:
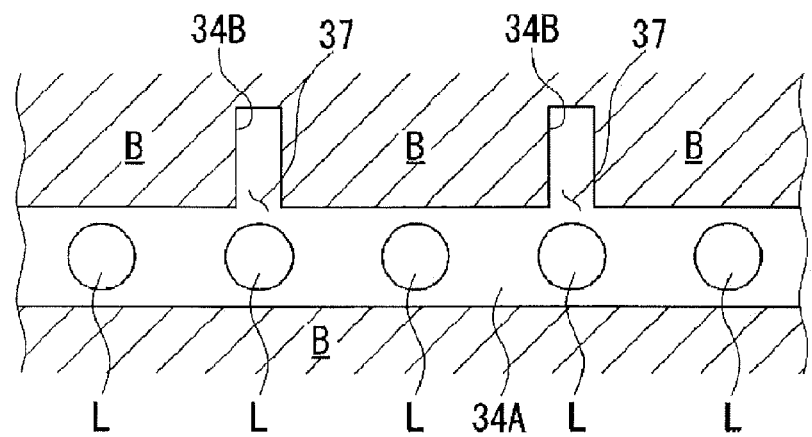
FIGS. 8A and 8B illustrate the method for forming a pattern of the third embodiment of the invention.

In order to form the wiring line 5 in the groove parts 34A and 34B, first, a droplet of the functional liquid L containing a wiring line forming ink to form the wiring line 5 is disposed at a predetermined position with the droplet discharge head 101 as shown in FIG. 8A. When the droplet of the functional liquid L is disposed to the first groove part 34A, the droplet is discharged from above the first groove part 34A by using the droplet discharge head 101. In the embodiment, the droplet of the functional liquid L is disposed along the longitudinal direction (the X-axis direction) of the first groove part 34A at a predetermined interval as shown in FIG. 8A. In this case, the droplet of the functional liquid L is also disposed in the vicinity of a connecting part 37 (intersection area) at which the first groove part 34A and the second groove part 34bB meet.

Figure 8B:
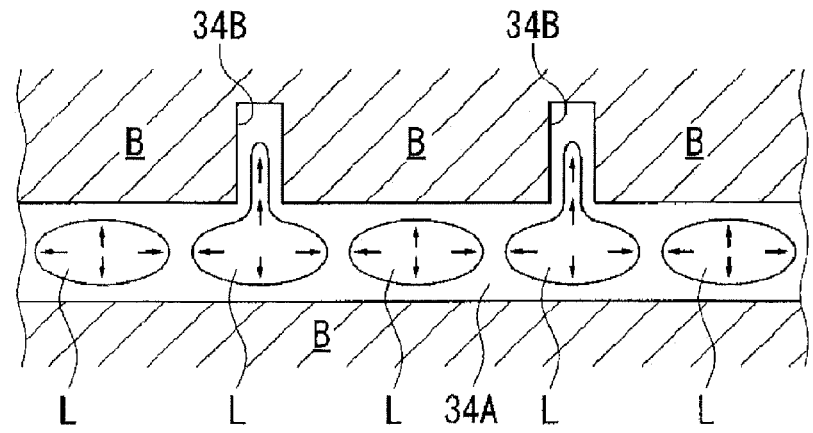

As shown in FIG. 8B, the functional liquid L disposed to the first groove part 34A wets and spreads in the first groove part 34A by an autonomous flow. Further, the functional liquid L disposed to the first groove part 34A also wets and spreads in the second groove part 34B by the autonomous flow. Accordingly; the functional liquid L can be disposed to the second groove part 34B without directly discharging a droplet to the second groove part 34B from above thereof. In this case, it is preferable that the side surface of the bank B have favorable wettability with respect to the functional liquid L. Since the side surface of the bank B does not have lyophobicity in the method of the first embodiment, the functional liquid L can smoothly flow in a region partitioned by the bank B with a capillary phenomenon even if the width of the area is narrowed.

As described above, the functional liquid L is disposed in the first groove part 34A and then the functional liquid L disposed in the first groove part 34A autonomously flows (by a capillary phenomenon) in the second groove part 34B to be disposed. Therefore, the functional liquid L can be smoothly disposed in the second groove part 34B by discharging a droplet of the functional liquid L in the first groove part 34A having the first width H1 (wide width) without discharging the droplet of the functional liquid L to the second groove part 34B having the second width H2 (narrow width) from above the bank B.

Particularly, even when the diameter of a droplet (the diameter of a flying droplet) discharged from the droplet discharge head 101 is larger than the width H2, which is narrow, of the second groove 34B, the functional liquid L can be smoothly disposed in the second groove part 34B by the autonomous flow of the functional liquid L. Since the width H2 is narrow, the functional liquid L is smoothly disposed in the second groove part 34B by a capillary phenomenon. As a result, a pattern having a desired shape can be formed. In addition, the functional liquid L can be smoothly disposed in the second groove part 34B having a narrow width, which can realize a fine pattern (pattern having a narrowed width). In contrast, a setback that part of the functional liquid L lands and remains on the upper surface of the bank B can be avoided even when the droplet of the functional liquid L is discharged to the first groove part 34A from above the bank B since the width H1 of the first groove part 34A is wide. As a result, the wiring line 5 that performs desired characteristics can be stably formed.

According to the embodiment, the functional liquid L is disposed in the vicinity of the connecting part 37 at which the first groove part 34A and the second groove part 34B meet in the first groove part 34A. This disposition allows the functional liquid L to easily flow in the second groove part 34B when the functional liquid L wets and spreads. As a result, the functional liquid L can be more smoothly disposed in the second groove part 34B.

In addition, lyophobicity is only to be given to the upper surface of the bank B and lyophilicity is to be given to the pattern forming region partitioned by the bank B since the bank B is formed by the method of the first embodiment in the embodiment. Thus, the functional liquid L can smoothly flow into a region partitioned by the bank B, improving uniformity of the wiring line 5 even when the wiring line 5 having a fine shape is formed.

After the functional liquid L is disposed in the first groove part 34A and the second groove part 34B, an intermediate drying step and the firing step are carried out in the same manner of the first embodiment. As a result, the wiring line 5 can be formed.

Figure 9:
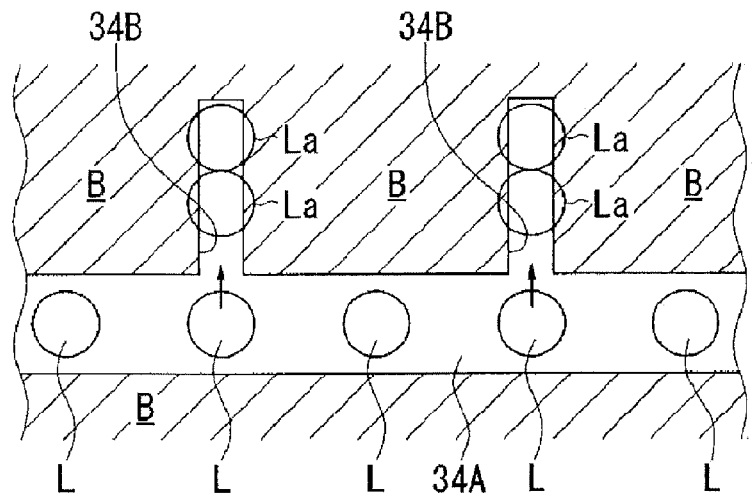
FIG. 9 illustrates the method for forming a pattern of the third embodiment of the invention.

As shown in FIG. 9, the functional liquid L may be disposed as described above after a functional liquid La that is made of only a solvent of the functional liquid L is discharged and disposed in the second groove part 34B. The functional liquid La discharged and disposed in the second groove part 34B makes the functional liquid L easily flow in the second groove part 34B, whereby the functional liquid L can be more smoothly disposed in the second groove part 34B. It should be noted that the functional liquid La has no conductivity since it does not contain conductive fine particles. For this reason, even when the functional liquid L remains on the bank B as a residue, it does not change the desired characteristics of the wiring line 5.

Figure 10A:
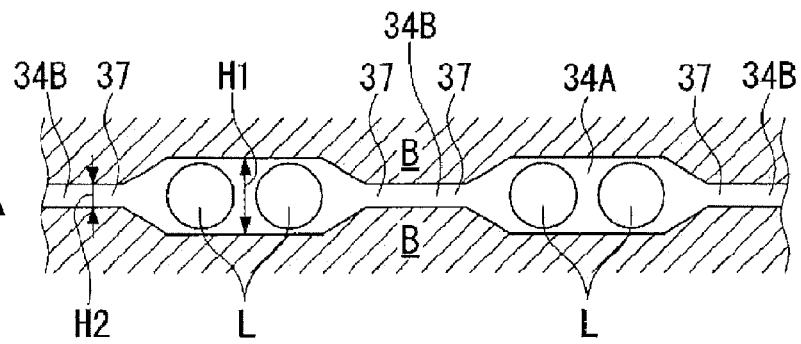
FIGS. 10A and 10B illustrate the method for forming a pattern of the third embodiment of the invention.
Figure 10B:
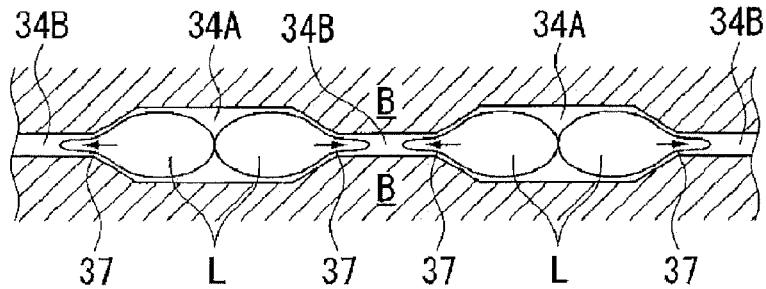

In FIGS. 7 through 9, the extending direction differs in the first groove part 34A having the first width H1 (wide width) and the second groove part 34B having the second width H2 (narrow width). However, as shown in FIGS. 10A and 10B, the first groove part 34A having the first width H1 and the second groove part 34B having the second width H2 may extend in the same direction. Also in this case, as shown in FIG. 10B, the functional liquid L can be disposed in the second groove part 34B by the autonomous flow of the functional liquid L by disposing the functional liquid L in the first groove part 34A as shown in FIG. 10A. In addition, the functional liquid L disposed in the first groove part 34A can smoothly flow in the second groove part 34B with the connecting part 37, at which the first groove part 34A and the second groove part 34B are connected, formed in a taper shape that the width progressively reduces from the first groove part 34A to the second groove part 34B.

Fourth Embodiment

Thin-Film Transistor

Figure 11:
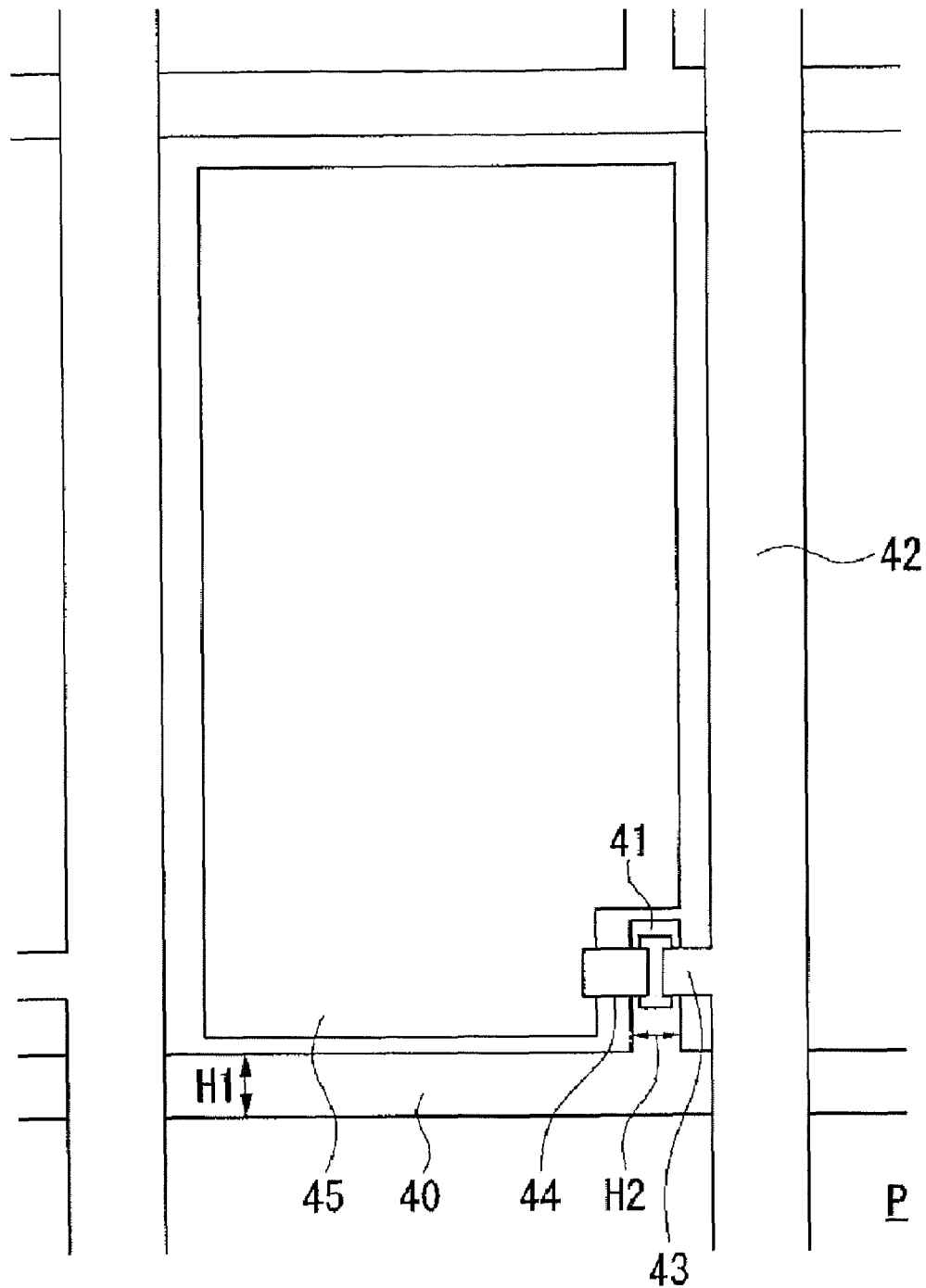
FIG. 11 is a schematic view showing an example of a substrate provided with a thin film transistor.

The method for forming a pattern of the first embodiment can be applied to form a thin film transistor (TFT) serving as a switching element as shown in FIG. 11 and a wiring line connected to the TFT. The fourth embodiment of the invention will be described below. In FIG. 11, a gate wiring line 40, a gate electrode 41 electrically connected to the gate wiring line 40, a source wiring line 42, a source electrode 43 electrically connected to the source wiring line 42, a drain electrode 44, and a pixel electrode 45 electrically connected to the drain electrode 44 are provided on a TFT substrate P having a TFT. The gate electrode 40 is provided to extend in the X-axis direction while the gate electrode 41 is provided to extend in the Y-axis direction.

The width H2 of the gate electrode 41 is narrower than the width H1 of the gate wiring line 40. The gate wiring line 40, the gate electrode 41, the source wiring line 42, the source electrode 43, and the drain electrode 44 can be formed by using the method for forming a pattern of the first embodiment.

Referring to FIGS. 12A through 12D, a method for manufacturing a TFT will be described.

Figure 12A:
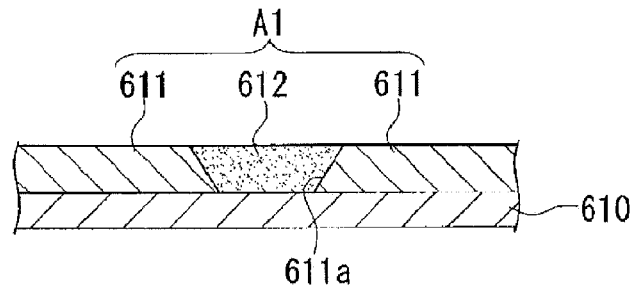
FIGS. 12A through 12D illustrate steps to manufacture the thin film transistor.

As shown in FIG. 12A, a bank 611 is formed on the upper surface of a glass substrate 610, which has been cleaned, by photolithography as a first layer. The bank 611 is used to form a groove (pattern forming region) 611a having a size of from ¹/₂₀ to ¹/₁₀ of one pixel pitch. A material including an inorganic material that mainly contains polysilazane is preferably used for the bank 611.

The bank 611 is formed by the method of the first embodiment. Because of this, lyophobicity is only given to the upper surface, not given to the side surface, of the bank 611. In addition, in the inside of the groove 611a, the hydroxyl group on the surface is substituted with the methyl group by the surface modification treatment.

In a gate scan electrode forming step, next to the bank forming step as the first layer, a gate scan electrode 612 is formed by discharging a functional liquid containing a hydrocarbon based dispersion medium by an inkjet method so as to fill the inside of the groove 611a, which is a drawing region partitioned by the bank 611, with it.

In this case, Ag, Al, Au, Cu, Pd, Ni, W—Si, and conductive polymers are preferably applicable for a conductive material contained in the functional liquid. The gate scan electrode 612, which is formed by the above step, can form a fine wiring pattern since enough lyophobicity is preliminary given to the bank 611 and the liquid does not run out of the groove 611a serving as a lyophilic region.

As a result of the above steps, a first conductive layer A1 is formed on the substrate 610. The first conductive layer A1 has a flat upper surface constructed by the bank 611 and the gate electrode 612.

In order to achieve a favorable discharge in the groove 611, the groove 611 preferably employ a quasi-tapered shape, which is tapered outwardly toward a discharging source, as shown in FIG. 12A. This shape makes it possible to dispose a discharged droplet into a sufficiently deep part.

Figure 12B:
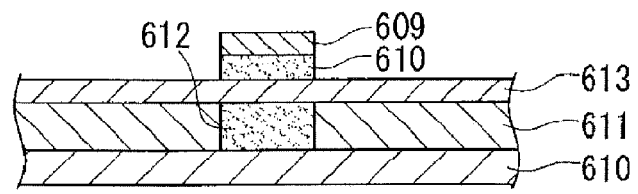

Next, as shown in FIG. 12B, a gate insulation film 613, an active layer 621, and a contact layer 609 are continuously formed by a plasma CVD method. A silicon nitride film for the gate insulation film 613, an amorphous silicon film for the active layer 621, and an n+ type silicon film for the contact layer 609 are formed by changing material gases and plasma conditions. When the CVD method is used, a thermal history of from 300° C. to 350° C. is required. However, the bank formed with an inorganic material mainly containing polysilazane can avoid the problem concerning transparency and heat resistance.

Figure 12C:
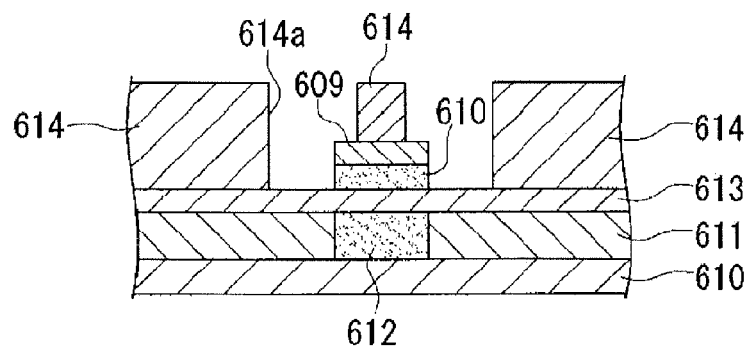

FIG. 12C shows a step to from a bank as a second layer, succeeding the above step of forming a semiconductor layer. In this step, a bank 614 is formed by photolithography. The bank 614 is used to form a groove (pattern forming region) 614a, which is formed on the upper surface of the gate insulation film 613, intersects the groove 611a and has a size of from ¹/₂₀ to ¹/₁₀ of one pixel pitch. The bank 614 needs to have optical transparency and lyophobicity after it is formed. A material including an inorganic material mainly containing polysilazane is preferably used in a same manner of the bank 611. The bank 614 also can be formed by the method of the first embodiment.

Therefore, the surface of the groove 614a, which is partitioned by the bank 614, has the substituted methyl group after the surface modification treatment.

Figure 12D:
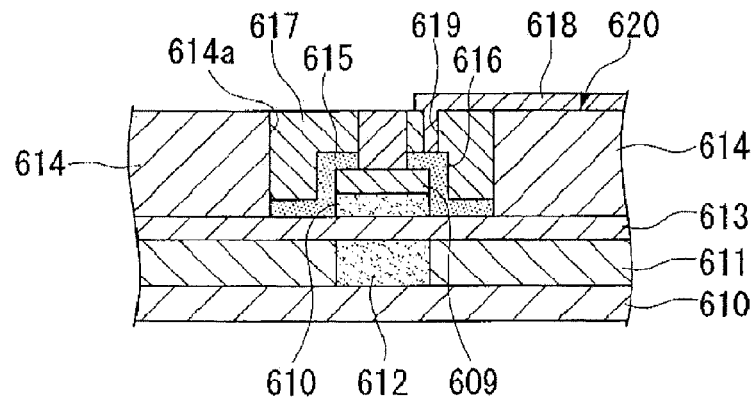

In a source-drain electrode forming step, succeeding the above bank forming step as the second layer, a source electrode 615 and a drain electrode 616 both of which intersect the gate electrode 612 are formed as shown in FIG. 12D. They are formed by discharging a functional liquid including a hydrocarbon based dispersion medium containing a conductive material by an inkjet method so as to fill the inside of the groove 614a, which is a drawing region partitioned by the bank 614, with it.

In this case, Ag, Al, Au, Cu, Pd, Ni, W—Si, and conductive polymers are preferably applicable for the conductive material. The source electrode 615 and the drain electrode 616, which are formed by the above step, can form a fine wiring pattern since enough lyophobicity is given to the upper surface of the bank 614 and the liquid favorably wets and spreads in the groove 614a having lyophilicity.

Also, an insulating material 617 is provided so as to fill the groove 614a in which the source electrode 615 and the drain electrode 616 are disposed. As a result of the above steps, a flat upper surface 620 constructed by the bank 614 and the insulation material 617 is formed above the substrate 610. Through the above steps, a TFT can be manufactured.

In addition, a pixel electrode 618 may be formed on the upper surface 620. Specifically, a bank (not shown) is formed on the upper surface 620 by performing the surface modification treatment and the like in the same manner of the above method. Then a pixel electrode forming ink (conductive functional liquid) is disposed in a pixel electrode forming region (conductive film pattern forming region) partitioned by the bank. In this case, since the pixel electrode forming ink favorably wets and spreads in the pixel electrode forming region, a pixel electrode (ITO) 618 having a uniform film thickness can be formed. The pixel electrode 618 is connected to the drain electrode 616 through a contact hole 619.

The gate electrode of all switching elements may be formed by the method for forming a pattern of the first embodiment. Part of gate electrodes may be formed by the method for forming a pattern of the first embodiment while another part of the gate electrodes may be formed by photolithography. Methods may be carried out taking the method for forming other elements into consideration to improve productivity.

Like wise, all gate wiring lines may be formed by the method for forming a pattern of the first embodiment. Part of gate wiring lines may be formed by the method for forming a pattern of the first embodiment while another part of the gate wiring lines may be formed by photolithography. Methods may be carried out taking the method for forming other elements and wiring lines into consideration to improve productivity.

Fifth Embodiment

Figure 13:
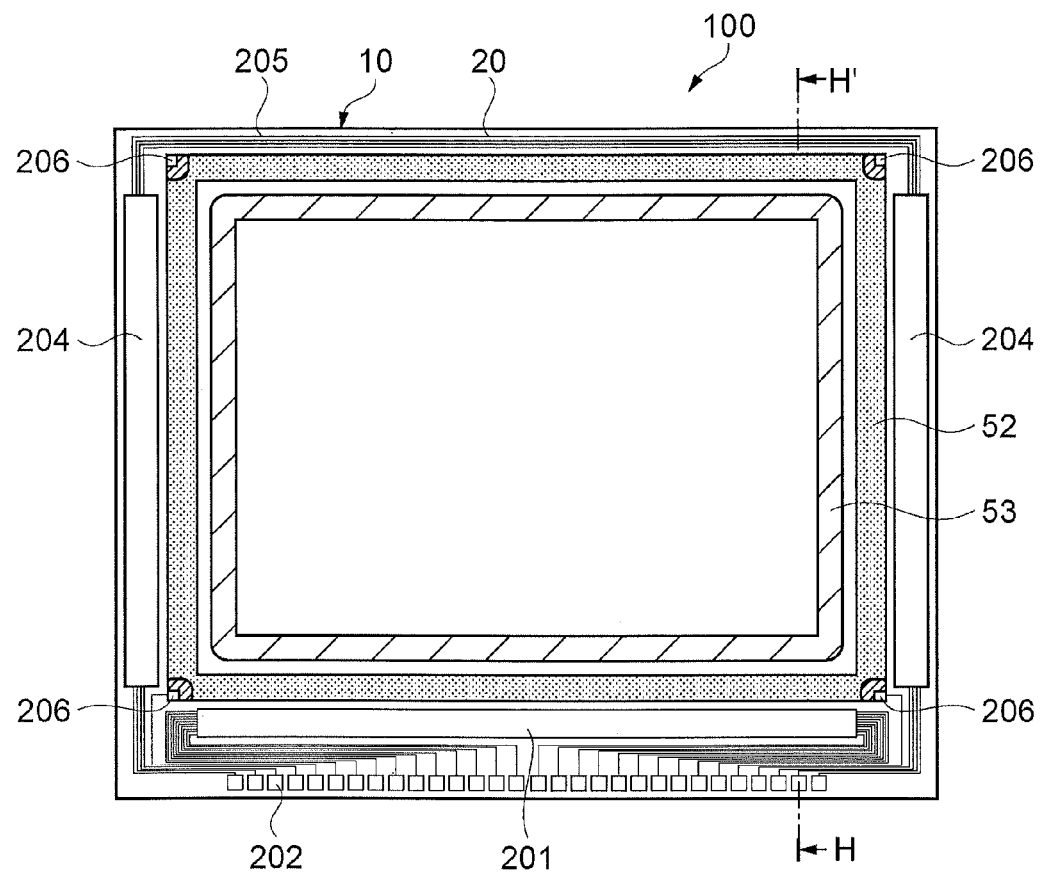
FIG. 13 is a plan view illustrating a liquid crystal display viewed from a counter substrate.
Figure 14:
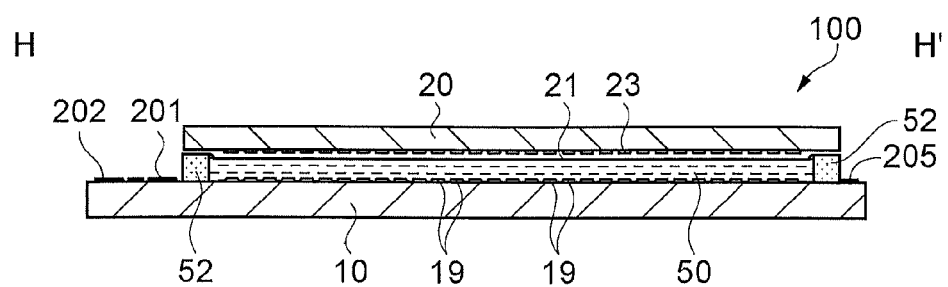
FIG. 14 is a sectional view taken along the line H-H' of FIG. 13.
Figure 15:
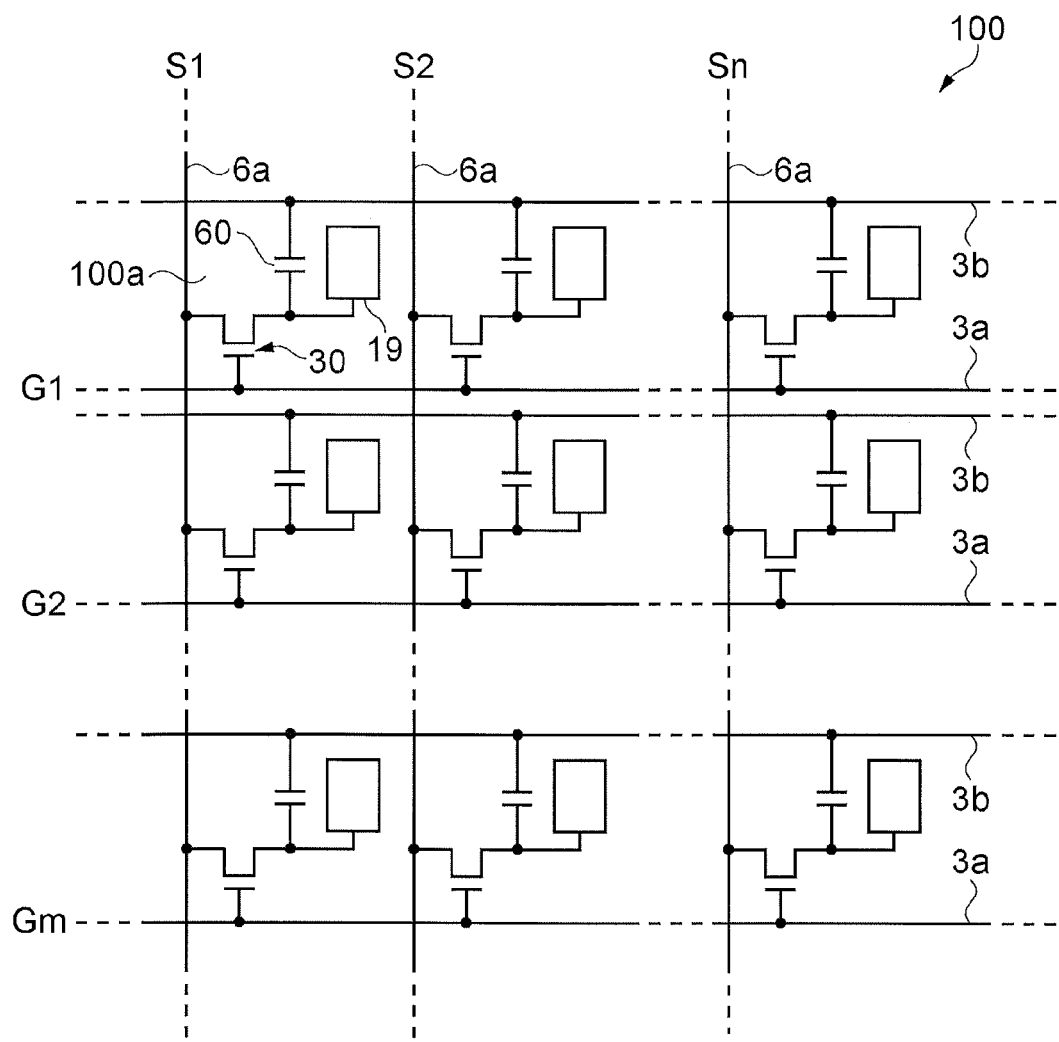
FIG. 15 is an equivalent circuit view of the liquid crystal display.
Figure 16:
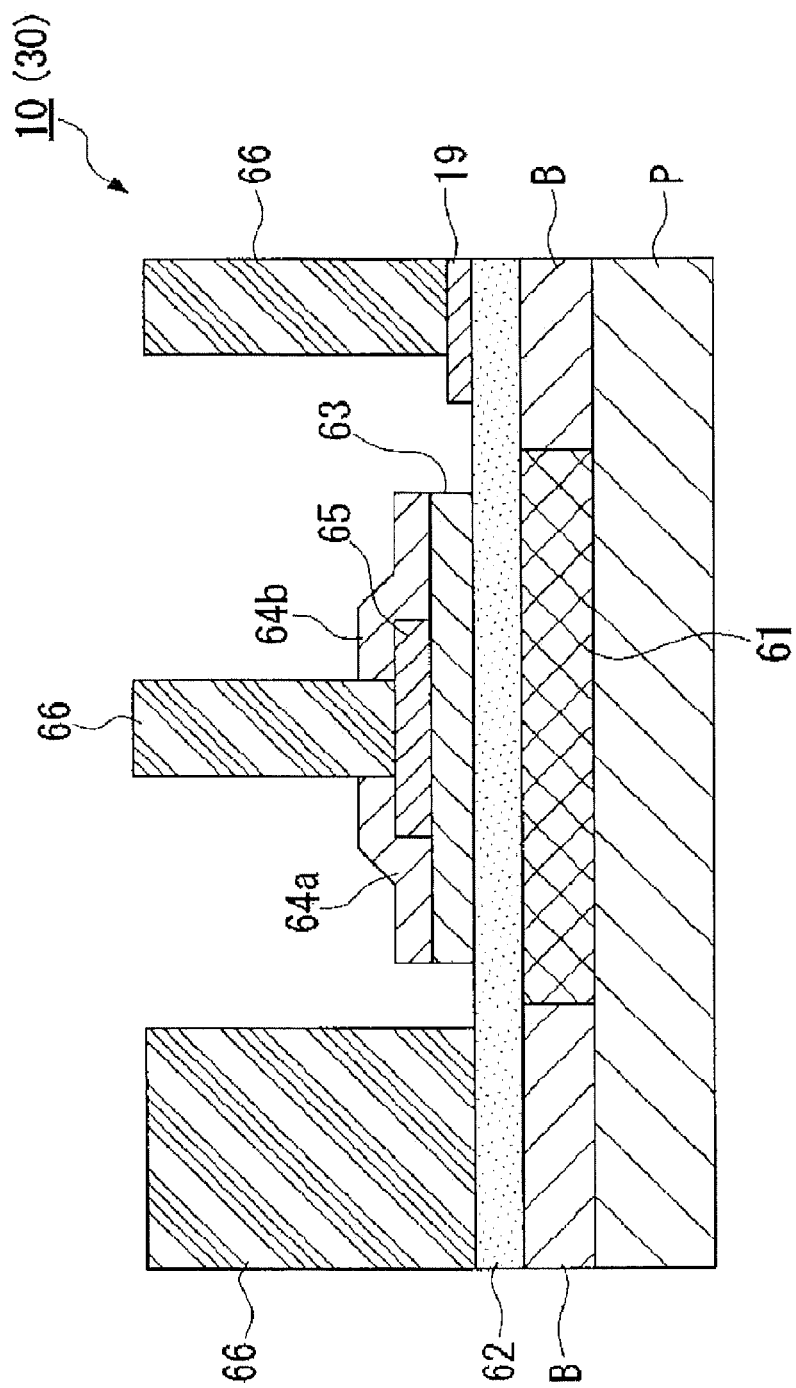
FIG. 16 is a partially enlarged view of the liquid crystal display.

Next, a liquid crystal display will be described with reference to drawings. FIG. 13 is a plan view of the liquid crystal display with each component viewed from a counter substrate. FIG. 14 is a sectional view taken along the line H-H' of FIG. 13. FIG. 15 is an equivalent circuit diagram showing elements, wiring lines, etc., in a plurality of pixels arranged in a matrix in an image display area of the liquid crystal display. FIG. 16 is a partially enlarged sectional view of the liquid crystal display. It should be noted that different scales are used for the layers and members in the drawings, so that the layers and members can be recognized.

In FIGS. 13 and 14, a liquid crystal display 100 includes a TFT array substrate 10 and a counter substrate 20, which is bonded to the substrate 10 as a pair with a photocurable sealant 52 interposed therebetween. In an area partitioned by the sealant 52, a liquid crystal 50 is sealed and held. The sealant 52 is formed in a frame shape closed in an area of the substrate surface. The sealant 52 has no liquid crystal injection inlet and no trace sealed with a sealing material.

On a side adjacent to the liquid crystal 50 of the TFT array substrate 10, pixel electrodes 19 are disposed each of which is connected to respective TFTs (not shown). On a side adjacent to the liquid crystal 50 of the counter substrate 20, a counter electrode 21 is disposed. A color filter 23 of red (R), green (G), and blue (B) is formed at a position opposite to each pixel electrode 19.

In a region inside the area where the sealant 52 is provided, a peripheral light-blocking film made of a light blocking material is provided. In an area outside the sealant 52, a data line driving circuit 201 and a mount terminal 202 are provided along one side of the TFT array substrate 10. Provided along two sides adjacent to the one side are scanning line driving circuits 204. Provided along another side of the TFT array substrate 10 are a plurality of wiring lines 205 to connect the scanning line driving circuits 204 provided to the both sides of an image display area. At one or more of the corners of the counter substrate 20, an inter-substrate conductive material 206 is disposed to provide electrical conductivity between the TFT array substrate 10 and the counter substrate 20.

In this regard, instead of providing the data line driving circuit 201 and the scanning line driving circuits 204 on the TFT array substrate 10, a tape automated bonding (TAB) substrate on which a driving LSI is mounted and a group of terminals provided around the TFT array substrate 10 may be electrically and mechanically connected with an anisotropic conductive film interposed therebetween. Note that a retardation film, a polarizer, etc., included in the liquid crystal display 100 are aligned in a predetermined direction (not shown) depending on the type of the liquid crystal 50, that is, operation modes including twisted nematic and super twisted nematic modes and normally white and normally black modes.

The liquid crystal display 100 is manufactured by the method according to the invention. The manufacturing method is characterized by the following steps: a step to form a conductive pattern (e.g. the pixel electrode 9, the TFT 30, and wiring lines connected to them) in a region partitioned by a bank; and a step to form the color filter 23. Others in the structure can be formed by known steps.

Specifically, the pixel electrode 19, the TFT 30, and the like in the liquid crystal display 100 are structured as follows: a bank is formed in the same manner of the method for forming a pattern; a functional liquid is disposed in a conductive pattern forming region partitioned by the bank; and the disposed functional liquid is fired.

Here, the method will be exemplary described on a step to form the color filter 23 included in the liquid crystal display 100 in order to display images with colors.

First, a bank is formed on the counter substrate 20 by patterning a bank film on which a lyophobic treatment has been performed. As a result, a color filter forming region partitioned by the bank is formed. The hydroxyl (—OH) group on the surface of the color filter forming region is substituted with the methyl (—$CH_3$) group by the surface modification treatment (HMDS treatment). Then, a functional liquid (color filter forming material) is disposed in the color filter forming region by using the droplet discharge device IJ. Here, the functional liquid includes a hydrocarbon based dispersion medium.

As a result, the functional liquid disposed in the color filter forming region, in which lyophobicity is given to the upper surface of the bank and lyophilicity is given to the side surface of the bank, favorably wets and spreads to be uniform thickness. The color filter formed by drying the functional liquid has high reliability with uniform thickness. Here, the color filter gives color to light by shielding a specific wavelength component of light passing through the filter. Since light amount the filter shields depends on its thickness, the thickness is an important factor that has an influence on the performance of the filter. Therefore, the liquid crystal display 100 according to the embodiment has high reliability since it is provided with a high performance color filter having uniform thickness.

In the image display area of the liquid crystal display 100 having the above-described structure, as shown in FIG. 15, a plurality of pixels 100a are arranged in a matrix. Each of the pixels 100a is provided with a TFT (switching element) 30 for switching a pixel. To the source of each TFT 30, each of data lines 6a that supply pixel signals S1 through Sn is electrically coupled. The pixel signals S1 through Sn written into the data lines 6a may be line-sequentially supplied in this order or in groups for a plurality of adjacent data lines 6a. To the gate of each TFT 30, each of scanning lines 3a is electrically coupled. To respective scanning lines 3a, scanning signals G1 through Gm are applied pulsatively and line-sequentially in this order at a predetermined timing.

A pixel electrode 19 is electrically coupled to the drain of the TFT 30. The TFT 30, which is a switching element, is turned on for a certain period, and thereby the pixel signals S1 through Sn supplied from the data lines 6a are written in respective pixels at a predetermined timing. The pixel signals S1 through Sn, each of which is in a predetermined level and written into liquid crystal through the pixel electrode 19, are retained between a counter electrode 21 of the counter substrate 20 shown in FIG. 14 and the respective pixel electrodes 19 for a certain period. In order to prevent a leak of the pixel signals S1 through Sn that are retained, a storage capacitor 60 is provided in parallel with a liquid crystal capacitance formed between the pixel electrode 19 and the counter electrode 21, and is connected to a common wiring line 3b. For example, the voltage of the pixel electrode 19 is retained by the storage capacitor 60 for a period of time three orders of magnitude longer than the time for which a source voltage is applied. Consequently, an electron retention property improves, thereby the liquid crystal display 100 with a high contrast ratio can be provided.

Sixth Embodiment

FIG. 16 is a partially enlarged sectional view of the liquid crystal device 100 including the TFT 30 of bottom-gate structure. On the substrate P made of glass included in the TFT array substrate 10, a gate wiring line 61 serving as a conductive film is formed by the method of the invention.

On the gate wiring line 61, a semiconductor layer 63 made of amorphous silicon (a-Si) is deposited with a gate insulation film 62 made of SiNx interposed therebetween. The part that faces the gate wiring line of the semiconductor layer 63 serves as a channel region. On the semiconductor layer 63, bonding layers 64a and 64b made of n+ type a-Si, for example, are deposited in order to provide ohmic bonding. On the central part of the semiconductor layer 63, i.e. of the channel region, an etch stop film 65 made of SiNX is formed that has insulation property and protects the channel. The gate insulation film 62, the semiconductor layer 63, and the etch stop film 65 are patterned as shown in FIG. 16 by the following steps: vapor deposition (CVD), resist coating, exposure and development, and photo etching.

Then, the bonding layers 64a and 64b and the pixel electrode 19 made of ITO are also deposited and photo etched in a same manner as described above, patterned as shown in FIG. 16. Next, a bank 66 is formed on each of the pixel electrode 19, the gate insulation film 62, and the etch stop film 65 like a protrusion. Then, a droplet of a silver compound is discharged in a region partitioned by the bank 66 using the droplet discharge device IJ, whereby source and drain lines can be formed.

The liquid display device 100 according to the embodiment can have high quality and performance since the pixel electrode 9, the color filter 23, and TFT 30 are accurately and stably formed.

What is claimed is:

1. A method for forming a pattern, comprising:
    forming a bank film on a substrate;
    coating a fluororesin material on a surface of the bank film to make the bank film lyphobic;
    patterning the lyophobic bank film to form a bank;
    performing a surface modification treatment in which a hydroxyl group on a surface of a pattern forming region partitioned by the bank is alkylated;
    firing the bank after the surface modification treatment;
    after firing the bank, disposing a functional liquid in the pattern forming region; and
    firing the functional liquid to form a pattern,
    wherein the surface modification treatment includes exposing the surface of the pattern forming region to a vapor of hexamethylsilazane.

2. The method for forming a pattern according to claim 1, wherein the functional liquid includes a hydrocarbon based dispersion medium.

3. The method for forming a pattern according to claim 1, wherein the bank is formed by a material including any one of polysilazane, polysilane, and polysiloxane.

4. The method for forming a pattern according to claim 3, wherein the bank is formed by a photosensitive material including any one of polysilazane, polysilane, and polysiloxane.

5. The method for forming a pattern according to claim 1, wherein the pattern is a wiring line.

6. The method for forming a pattern according to claim 1, wherein the pattern is a transparent electrode.

7. The method for forming a pattern according to claim 1, wherein the pattern is a color filter included in a liquid crystal display.

8. A method for manufacturing a liquid crystal display including a color filter, comprising:
    forming a bank film on a substrate;
    forming a fluororesin material on a surface of the bank film to make the bank film lyophobic;
    patterning the lyophobic bank film to form a bank;
    performing a surface modification treatment in which a hydroxyl group on a surface of a color filter forming region partitioned by the bank is alkylated;
    after performing the surface modification treatment, firing the bank;
    after firing the bank, disposing a color filter forming material in the color filter forming region; and
    firing the color filter forming material to form the color filter,
    wherein the surface modification treatment includes exposing the surface of the color filter forming region to a vapor of hexamethylsilazane.

9. A method for manufacturing a liquid crystal display including a conductive film pattern formed in a region partitioned by a bank, comprising:
    forming a bank film on a substrate;
    forming a fluororesin material on a surface of the bank film to make the bank film lyophobic;
    patterning the lyophobic bank film on which the lyophobic treatment has been performed to form the bank;
    performing a surface modification treatment in which a hydroxyl group on a surface of a conductive film pattern forming region partitioned by the bank is alkylated;
    after performing the surface modification treatment, firing the bank;
    after firing the bank, disposing a conductive functional liquid in the conductive film pattern forming region; and
    firing the conductive functional liquid to form the conductive film pattern,
    wherein the surface modification treatment includes exposing the surface of the conductive film pattern forming region to a vapor of hexamethylsilazane.

10. The method of claim 1, wherein the bank film is formed of polymethylsilaxane.

11. The method of claim 8, wherein the bank film is formed of polymethylsilaxane.

12. The method of claim 9, wherein the bank film is formed of polymethylsilaxane.

* * * * *